United States Patent [19]
Parris et al.

[11] Patent Number: 5,777,361
[45] Date of Patent: Jul. 7, 1998

[54] SINGLE GATE NONVOLATILE MEMORY CELL AND METHOD FOR ACCESSING THE SAME

[75] Inventors: Patrice M. Parris; Yee-Chaung See, both of Phoenix, Ariz.

[73] Assignee: Motorola, Inc., Schaumburg, Ill.

[21] Appl. No.: 657,127

[22] Filed: Jun. 3, 1996

[51] Int. Cl.[6] .......... H01L 29/788; H01L 29/76; H01L 29/792
[52] U.S. Cl. .......... 257/322; 257/314; 257/315; 257/316; 257/317; 257/318; 257/326
[58] Field of Search .......... 257/314, 316, 257/322, 326, 315, 317, 318

[56] References Cited

U.S. PATENT DOCUMENTS

| | | |
|---|---|---|
| 3,660,819 | 5/1972 | Frohman-Bentchkowsky . |
| 3,836,992 | 9/1974 | Abbas et al. . |
| 3,893,151 | 7/1975 | Bosselaar et al. .......... 257/318 |
| 3,938,108 | 2/1976 | Salsbury et al. . |
| 3,952,325 | 4/1976 | Beale et al. . |
| 4,019,197 | 4/1977 | Lohstroh et al. . |
| 4,087,795 | 5/1978 | Rossler .......... 365/185 |
| 4,185,319 | 1/1980 | Stewart . |
| 4,229,755 | 10/1980 | Custode .......... 257/326 |
| 4,380,057 | 4/1983 | Kotecha et al. . |
| 4,982,377 | 1/1991 | Iwasa .......... 257/316 |
| 4,990,979 | 2/1991 | Otto .......... 257/316 |
| 5,027,171 | 6/1991 | Reedy et al. . |
| 5,042,008 | 8/1991 | Iwasa et al. .......... 365/185 |
| 5,268,585 | 12/1993 | Yamauchi .......... 257/316 |
| 5,289,026 | 2/1994 | Ong .......... 257/316 |
| 5,397,715 | 3/1995 | Miller .......... 257/346 |
| 5,420,449 | 5/1995 | Oji .......... 257/316 |
| 5,436,479 | 7/1995 | Devin .......... 257/314 |
| 5,440,158 | 8/1995 | Sung-Mu .......... 257/314 |
| 5,440,510 | 8/1995 | Caprara et al. .......... 257/314 |
| 5,455,788 | 10/1995 | Clark . |
| 5,461,249 | 10/1995 | Ozawa .......... 257/322 |
| 5,465,231 | 11/1995 | Ohsaki . |
| 5,479,367 | 12/1995 | Maurelli et al. . |
| 5,514,890 | 5/1996 | Yang et al. .......... 257/316 |
| 5,552,621 | 9/1996 | Kowalski .......... 257/322 |
| 5,554,552 | 9/1996 | Chi .......... 257/315 |
| 5,576,569 | 11/1996 | Yang et al. .......... 257/321 |

FOREIGN PATENT DOCUMENTS

| | | | |
|---|---|---|---|
| 2133967 | 5/1990 | Japan .......... | H01L 29/788 |
| 9400881 | 1/1994 | WIPO .......... | H01L 29/78 |
| 9422171 | 9/1994 | WIPO .......... | H01L 29/78 |

OTHER PUBLICATIONS

Muller et al., Device Electronics for Integrated Circuits, Chapter 9: Floating–Gate Memory Element, pp. 452–453, 1986.

Bentchkowsky, Famos—A New Semiconductor Charge Storage Device, Solid–State Electronics, vol. 17, pp. 517–529, Aug. 13, 1973.

Dov Frohman–Bentchkowsky—Intel Corp., Solid State Electronics, "FAMOS—A New Semiconductor Charge Storage Device", 1974, vol. 17, pp. 517–529.

*Primary Examiner*—Valencia Wallace
*Attorney, Agent, or Firm*—Rennie William Dover; Ziye Zhou

[57] ABSTRACT

A nonvolatile memory cell (10) includes a single n-channel insulated gate FET (11) having a single floating gate (12). The FET (11) operates asymmetrically in a sense that the capacitance of a parasitic gate-source capacitor (24) is smaller than the capacitance of a parasitic gate-drain capacitor (26). The asymmetric condition is achievable either by fabricating the FET (11) as an asymmetric structure (30, 60) or by adjusting the capacitance of the parasitic capacitors (24, 26) through terminal biasing when the FET (11) is a short channel device. The potential of the floating gate (12) is controlled by biasing the source (14), drain (16), and substrate (18) of the FET (11). The cell (10) is programmed by moving charge onto the floating gate (12) via hot carrier injection, erased by moving charge from the floating gate (12) via tunneling, and read by sensing the conductive state of the FET (11).

19 Claims, 1 Drawing Sheet

SINGLE GATE NONVOLATILE MEMORY CELL AND METHOD FOR ACCESSING THE SAME

BACKGROUND OF THE INVENTION

The present invention relates, in general, to memory cells and, more particularly, to nonvolatile memory cells.

Electrically Erasable Programmable Read Only Memories (EEPROMs) are well known in the art. They permit storing data that can be retained even if power to the memory is removed. Most EEPROMs store data by storing electrical charge in an electrically isolated floating gate of a field effect transistor (FET). The floating gate controls the memory state of the FET.

There are two common approaches for isolating a floating gate structure and capacitively coupling the floating gate so it can be programmed or erased. The first approach uses a double dielectric/conductor stack to form a floating gate between two dielectric layers which is controlled by a second conductor referred to as a control gate. When the gates are polycrystalline silicon gate structures, the memory cell is referred to as a double-poly nonvolatile memory cell and the dielectric between the floating gate and the control gate is referred to as an inter-poly dielectric. The control gate is used to place a voltage potential on the floating gate to control the movement of charge to and from the floating gate. When the voltage is removed from the control gate, the charge in the floating gate provides a stored voltage potential which determines the data value in the nonvolatile memory cell. The structure requires the formation of two conductive layers. In most conventional nonvolatile memory technologies, this is accomplished with two polycrystalline silicon depositions.

The second approach uses a single gate structure, which is also referred to as a single-poly nonvolatile memory cell. In the single-poly nonvolatile memory cell, a dielectric layer on the silicon substrate adjacent the FET functions as the inter-poly dielectric layer. An isolated region of the silicon substrate under the dielectric layer functions as the control gate. A floating polycrystalline silicon gate covers both the oxide layer of the FET and the dielectric layer above the control gate. The single-poly nonvolatile memory cell requires only one polycrystalline silicon deposition and, therefore, is simple and inexpensive to fabricate compared with the double-poly nonvolatile memory cell. However, additional silicon area is used in the single-poly nonvolatile memory cell to form the inter-poly dielectric and the control gate.

Accordingly, it would be advantageous to provide a structure for a nonvolatile memory cell and a method for accessing the nonvolatile memory cell. It is desirable for the nonvolatile memory cell to be simple and inexpensive to fabricate. It is also desirable for the nonvolatile memory cell to be silicon area efficient. It would be of further advantage for the nonvolatile memory cell to be both electrically erasable and electrically programmable.

DETAILED DESCRIPTION OF THE DRAWINGS

Figure 1:
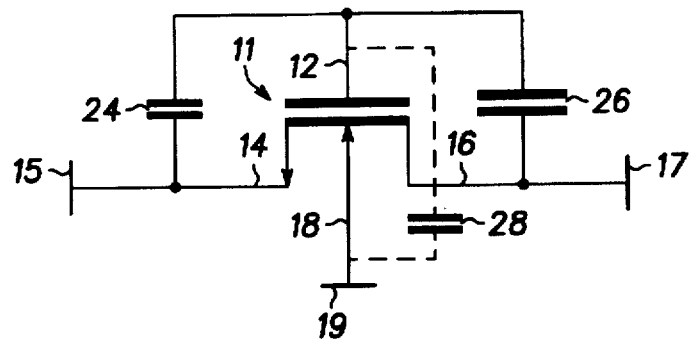
FIG. 1 is a schematic diagram of a nonvolatile memory cell in accordance with the present invention.

FIG. 1 is a schematic diagram of a nonvolatile memory (NVM) cell 10 in accordance with the present invention. NVM cell 10 includes a field effect transistor (FET) 11 which has a gate 12, a source electrode 14, a drain electrode 16, and a substrate electrode 18. Preferably, FET 11 is an n-channel insulated gate FET. Gate 12 is electrically isolated from external circuitry and, therefore, is also referred to as a floating gate of FET 11. Source electrode 14 is coupled for receiving an erasing signal via a source line 15. Drain electrode 16 is coupled for receiving a programming signal and a reading signal via a drain line 17. Drain line 17 is further coupled to a sense amplifier (not shown) for transmitting a data signal of NVM cell 10. Substrate electrode 18 is coupled for receiving a back biasing signal via a substrate line 19. FIG. 1 also shows a parasitic gate-source capacitor 24 which capacitively couples gate 12 to source electrode 14, a parasitic gate-drain capacitor 26 which capacitively couples gate 12 to drain electrode 16, and a parasitic gate-substrate capacitor 28 which capacitively couples gate 12 to substrate electrode 18. Because NVM cell 10 includes a single insulated gate FET 11 which has a single gate 12, NVM cell 10 is also referred to as a single transistor, single gate nonvolatile memory cell or a single-poly nonvolatile memory cell.

It should be noted that FET 11 is not limited to being an n-channel insulated gate FET. FET 11 can be replaced by any transistor which has an insulated gate structure. For example, FET 11 can be replaced by a p-channel insulated gate FET, an insulated gate bipolar transistor, or the like.

The logic values of data stored in NVM cell 10 are determined according to the electric charge stored in floating gate 12. The electric charge moves onto floating gate 12 through a hot carrier injection process and moves from floating gate 12 through a tunneling process. The motion of electric charge onto or from floating gate 12 is controlled by the voltage signals applied to source electrode 14, drain electrode 16, and substrate electrode 18 of FET 11 via source line 15, drain line 17, and substrate line 19, respectively. Preferably, FET 11 operates asymmetrically in a sense that a capacitance of gate-source capacitor 24 is different from a capacitance of gate-drain capacitor 26. More particularly, the capacitance of gate-source capacitor 24 is preferably smaller than the capacitance of gate-drain capacitor 26.

Figure 2:
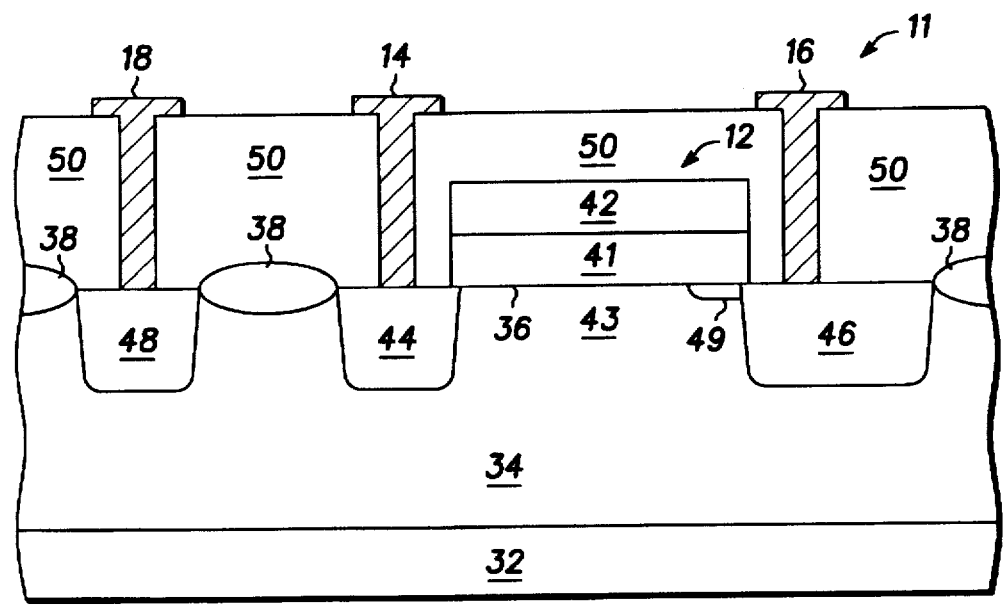
FIG. 2 is an enlarged cross-sectional view of an embodiment of the nonvolatile memory cell of FIG. 1.

FIG. 2 is an enlarged cross-sectional view of a structure 30, which is an embodiment of NVM cell 10 of FIG. 1. It should be noted that the same reference numbers are used in the figures to represent the same elements. FET 11 is fabricated in a body of semiconductor material such as a silicon substrate 32 having a major surface 36. A p-well 34 is formed extending from major surface 36 into substrate 32. Field oxide regions 38 are formed to electrically isolate FET 11 from other devices (not shown) that could be formed in substrate 32. A gate oxide layer 41 is formed by growing a layer of oxide on major surface 36. A layer 42 of polycrystalline silicon is deposited on gate oxide layer 41. By way of example, polycrystalline silicon layer 42 has an n-type conductivity and a dopant concentration ranging from approximately $10^{15}$ atoms per cubic centimeter (atoms/cm$^3$) to approximately $10^{22}$ atoms/cm$^3$. Polycrystalline silicon layer 42 and gate oxide layer 41 are then patterned and etched to form a floating gate structure over a channel region 43 in substrate 32. The gate structure serves as floating gate 12 of FET 11.

A source region 44 is formed by implanting a dopant of n-type conductivity such as, for example, phosphorus or arsenic, into p-well 34 adjacent channel region 43. Source region 44 extends from major surface 36 into p-well 34. Likewise, a drain region 46 is formed by implanting a dopant of n-type conductivity such as, for example, phosphorus or arsenic, into p-well 34 adjacent channel region 43 and opposite to source region 44. Drain region 46 extends from major surface 36 into p-well 34. The energy and dose of the implanted ions are adjusted so that source region 44 and drain region 46 have dopant concentrations ranging, for example, from approximately $10^{18}$ atoms/cm$^3$ to approximately $10^{22}$ atoms/cm$^3$.

To achieve the asymmetric characteristics as described with reference to FIG. 1, an area of overlap between floating gate 12 and source region 44 is preferably different from an area of overlap between floating gate 12 and drain region 46. By way of example, source region 44 and drain region 46 are formed in two doping steps. In the first doping step, a dopant of n-type conductivity is implanted into the portion of p-well 34 where drain region 46 is to be formed. The implantation is followed by a diffusion process such as, for example, a rapid thermal annealing process. In the second doping step, a dopant of n-type conductivity is implanted into regions of p-well 34 where source region 44 and drain region 46 are to be formed. The second implantation is followed by another diffusion process to form source region 44 and drain region 46. The formation of drain region 46 includes additional ion implantation and diffusion processes compared with the formation of source region 44. As a result, drain region 46 extends horizontally or laterally into the regions under oxide layer 41 to a greater distance than source region 44. Drain region 46 also extends further into p-well 34 than source region 44. For example, the depth of source region 44 is approximately 0.3 micrometer (μm) and the depth of drain region 46 is approximately 0.4 μm. Because of the different dimensions between source region 44 and drain region 46, a capacitance of parasitic gate-source capacitor 24 (shown in FIG. 1) is different from a capacitance of parasitic gate-drain capacitor 26 (shown in FIG. 1). More particularly, the capacitance of gate-source capacitor 24 is smaller than the capacitance of gate-drain capacitor 26.

It should be noted that the method for adjusting the capacitance of parasitic gate-source capacitor 24 and gate-drain capacitor 26 described hereinbefore is not a limitation of the present invention. In addition to controlling the sizes of source region 44 and drain region 46, the capacitance of a parasitic capacitor in FET 11 may be adjusted by adjusting the dopant concentration of the region. Therefore, the capacitance of gate-drain capacitor 26 may be made larger than the capacitance of gate-source capacitor 24 by doping drain region 46 to a higher dopant concentration than that of source region 44, while maintaining the same depth and width for source region 44 and drain region 46. Another approach for adjusting the capacitance values of parasitic gate-source capacitor 24 and gate-drain capacitor 26 involves adjusting the horizontal extension of source region 44 and drain region 46, respectively, into the regions under gate oxide layer 41 while keeping the depths of source region 44 and drain region 46 substantially equal to each other using techniques such as, for example, angled implantation. A larger extension, i.e., a larger overlap between floating gate 12 and the respective source or drain region, usually results in a larger capacitance.

A drain side implantation region 49 is formed in channel region 43 under a portion of dielectric layer 41 and adjacent drain region 46 by implanting ions of n-type conductivity such as, for example, arsenic, into the region. The energy and dose of the arsenic ions are adjusted so that drain side implantation region 49 extends from major surface 36 into substrate 32 to a depth of, for example, approximately 0.2 μm and has a dopant concentration ranging, for example, from approximately $10^{17}$ atoms/cm$^3$ to approximately $10^{20}$ atoms/cm$^3$. The dopant concentration in drain side implantation region 49 is preferably lower than the dopant concentration of drain region 46. Drain side implantation region 49 serves to improve the hot carrier injection efficiency when programming NVM cell 10. It should be noted that, although preferred, drain side implantation region 49 is optional.

A well contact region 48 is formed in p-well 34 by implanting a dopant of p-type conductivity such as, for example, boron, into p-well 34. The energy and dose of the implanted boron ions are adjusted so that well contact region 48 has a dopant concentration ranging, for example, from approximately $10^{18}$ atoms/cm$^3$ to approximately $10^{22}$ atoms/cm$^3$.

A dielectric layer 50 is formed on substrate 32 to provide electrical isolation between FET 11 and other electronic elements (not shown) that are formed on substrate 32. Dielectric layer 50 is typically formed by oxidation, deposition, or a combination of both. To form electrical connections to FET 11, dielectric layer 50 is patterned and etched to expose portions of source region 44, drain region 46, and well contact region 48. Using metallization techniques known in the art, a source electrode 14, a drain electrode 16, and a substrate electrode 18 are formed to contact source region 44, drain region 46, and well contact region 48, respectively.

Figure 3:
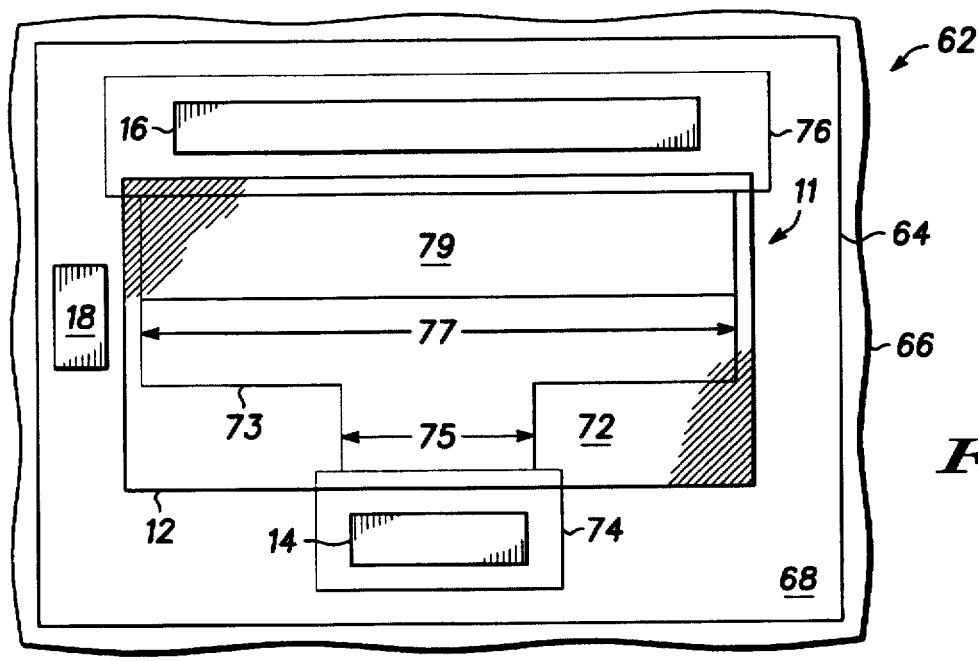
FIG. 3 is an enlarged top view of another embodiment of the nonvolatile memory cell of FIG. 1.

FIG. 3 is an enlarged top view of a structure 60 which is another embodiment of NVM cell 10 of FIG. 1. It should be noted that the same reference numbers are used in the figures to represent the same elements. FET 11 of NVM cell 10 is fabricated in a body of semiconductor material such as a substrate 62 having a major surface 66. A p-well 64 is formed extending from major surface 66 into substrate 62. A field oxide region 68 is formed to electrically isolate FET 11 from other devices (not shown) that could be formed in substrate 62. Furthermore, field oxide region 68 is patterned to define the size and shape of an active region within p-well 64. A gate oxide layer (not shown) is formed by growing a layer of oxide on major surface 66. A layer 72 of polycrystalline silicon is deposited on the gate oxide layer. By way of example, polycrystalline silicon layer 72 is of n-type conductivity. Polycrystalline silicon layer 72 and the gate oxide layer are then patterned and etched to form a floating gate structure over a channel region 73 in substrate 62. The floating gate structure serves as floating gate 12 of FET 11.

A source region 74 and a drain region 76 are formed by implanting a dopant of n-type conductivity such as, for example, phosphorus or arsenic, into portions of the active region in p-well 64 adjacent channel region 73. The energy and dose of the implanted ions are adjusted so that source region 74 and drain region 76 extend from major surface 66 into substrate 62 to a depth of, for example, approximately 0.35 μm and have dopant concentrations ranging, for example, from approximately $10^{18}$ atoms/cm$^3$ to approximately $10^{22}$ atoms/cm$^3$.

A drain side implantation region 79 is formed in channel region 73 under a portion of floating gate 12 and adjacent drain region 76 by implanting ions of n-type conductivity such as, for example, arsenic, into the region. The energy and dose of the arsenic ions are adjusted so that drain side implantation region 79 extends from major surface 66 into substrate 62 to a depth of, for example, approximately 0.2 μm and has a dopant concentration ranging, for example, from approximately $10^{17}$ atoms/cm$^3$ to approximately $10^{20}$ atoms/cm$^3$. The dopant concentration in drain side implantation region 79 is preferably lower than the dopant concentration of drain region 76. Drain side implantation region 79 serves to improve the hot carrier injection efficiency when programming NVM cell 10. It should be noted that, although preferred, drain side implantation region 79 is optional.

A well contact region (not shown) is formed in p-well 64 by implanting a dopant of p-type conductivity such as, for example, boron, into p-well 64. The energy and dose of the implanted boron ions are adjusted so that the well contact region has a dopant concentration ranging, for example, from approximately $10^{18}$ atoms/cm$^3$ to approximately $10^{22}$ atoms/cm$^3$.

A dielectric layer (not shown) is formed on substrate 32 over field oxide region 68, floating gate 12, source region 74, and drain region 76. The dielectric layer is typically made from silicon dioxide. To form electrical connections to FET 11, the dielectric layer is patterned and etched to expose portions of source region 74, drain region 76, and the well contact region. Using metallization techniques known in the art, electrical contacts are made to source region 74, drain region 76, and the well contact region, thereby forming source electrode 14, drain electrode 16, and substrate electrode 18, respectively, of FET 11.

To achieve the asymmetric characteristics as described with reference to FIG. 1, the shape of channel region 73 is preferably asymmetric with respect to source region 74 and drain region 76. In FIG. 3, the width of channel region 73 near source region 74 is indicated by arrows 75 and the width of channel region 73 near drain region 76 is indicated by arrows 77. Field oxide region 68 is patterned so that the width of channel region 73 near source region 74 is less than the width of channel region 73 near drain region 76. Consequently, the capacitance of parasitic gate-source capacitor 24 (FIG. 1) is smaller than the capacitance of parasitic gate-drain capacitor 26 (FIG. 1).

It should be noted that the capacitance values of parasitic capacitors 24 and 26 in structure 60 may be further adjusted by adjusting the dopant concentrations and sizes of source and drain regions 74 and 76, respectively. The capacitance values of parasitic gate-source capacitor 24 and gate-drain capacitor 26 are further adjustable by adjusting the horizontal extension of source region 74 and drain region 76, respectively, into the regions under floating gate 12. A larger extension, i.e., a larger overlap between floating gate 12 and the respective source region 74 or drain region 76, usually results in a larger parasitic capacitance.

It should be understood that, in accordance with the present invention, the approaches for adjusting the capacitance of a parasitic capacitor of FET 11 are not limited to the process approach described with reference to structure 30 of FIG. 2 and the layout approach described with reference to structure 60 of FIG. 3. For example, a short channel insulated gate FET having a channel length less than, for example, approximately 1 μm may serve as FET 11 in NVM cell 10. As those skilled in the art are aware, a bias such as, for example, a drain-source bias, applied to a short channel FET significantly affects the capacitance values of parasitic gate-source and gate-drain capacitors in the FET. Therefore, parasitics such as the capacitance of a parasitic capacitor in a short channel FET of an NVM cell can be adjusted using the biasing applied to the short channel FET during the processes of programming, erasing, and reading data in the NVM cell.

Accessing NVM cell 10 of FIG. 1 includes three parts: programming NVM cell 10, erasing NVM cell 10, and reading data stored in NVM cell 10. These are achieved through biasing source electrode 14, drain electrode 16, and substrate electrode 18 of FET 11 to selected voltage levels. When floating gate 12 is electrically neutral, the voltage level of floating gate 12 ($V_G$) is related to the source voltage level ($V_S$), the drain electrode voltage level ($V_D$), and the substrate voltage level ($V_B$). The relation is approximated by equation 1:

$$V_G = \frac{C_{GS}}{C_T} V_S + \frac{C_{GD}}{C_T} V_D + \frac{C_{GB}}{C_T} V_B, \quad \text{(equation 1)}$$

where $C_{GS}$, $C_{GD}$, and $C_{GB}$ are the capacitance values of parasitic gate-source capacitor 24, gate-drain capacitor 26, and gate-substrate capacitor 28, respectively, and $C_T$ is equal to the SUM Of $C_{GS}$, $C_{GD}$, and $C_{GB}$. When there is electric charge on floating gate 12, its voltage level is shifted from the voltage level described in equation 1. The amount by which the voltage is shifted is determined by the surface charge density on floating gate 12. The effect of this voltage shift is analogous to the effect of shifting the threshold voltage of FET 11, so that the threshold voltage ($V_T$) of FET 11 is approximated by equation 2:

$$V_T = V_{T0} - \frac{Q_G}{C_{ox}}, \quad \text{(equation 2)}$$

where $V_{T0}$ is the threshold voltage of FET 11 when floating gate 12 is electrically neutral, $Q_G$ is the surface charge density on floating gate 12, and $C_{OX}$ is the capacitance per unit area across the dielectric layer between floating gate 12 and the channel region of FET 11.

To program NVM cell 10 via hot carrier injection, source electrode 14 and substrate electrode 18 of FET 11 are coupled to a ground voltage level. A programming voltage level ($V_P$) of, for example, 7.5 volts (V), is applied to drain electrode 16. According to equation 1, the voltage level at floating gate 12 is approximated by equation 3:

$$V_G = \frac{C_{GD}}{C_T} V_P. \quad \text{(equation 3)}$$

Because of the large capacitance of $C_{GD}$ compared with $C_{GS}$, $V_G$ is at a high voltage level. More particularly, $V_G$ is comparable to the programming voltage level $V_P$. FET 11 is switched on and a current flows through the channel region of FET 11. In the channel region of FET 11 adjacent the drain region, the voltages of floating gate 12 and drain electrode 16 cause hot carriers to be generated and injected into floating gate 12. When FET 11 is an n-channel insulated gate FET, the hot carriers are electrons. Preferably, $V_P$, $C_{GD}$, and $C_T$ are adjusted so that $V_G$ is in a range which results in efficient hot carrier injection. A drain side implantation region, such as region 49 of FIG. 2 or region 79 of FIG. 3, further improves the hot carrier injection efficiency. As the hot carriers, which are electrons having negative charge, move from the channel region onto floating gate 12, the threshold voltage $V_T$ of FET 11 increases according to equation 2. Thus, the current flowing through the channel of FET 11 decreases and so does the rate of hot carrier injection. Eventually, FET 11 is switched off and hot carrier injection stops. After the programming voltage level ($V_P$) is removed from drain electrode 16, the injected carriers remain on floating gate 12. In an alternative embodiment, the programming voltage level ($V_P$) is removed from drain electrode 16 before FET 11 is switched off by the rising threshold voltage, thereby terminating the programming process. In either case, a logic one is written into NVM cell 10, i.e., NVM cell 10 is programmed.

It should be noted that source electrode 14 and substrate electrode 18 of FET 11 are not limited to being coupled to a ground voltage level during the programming process. In an alternative embodiment, source electrode 14 and substrate electrode 18 are biased to nonzero voltage levels, thereby adjusting $C_{GS}$, $C_{GD}$, and $C_{GB}$ and optimizing the programming process. In another alternative embodiment, a positive programming voltage level ($V_P$) of, for example, 11V, is applied to both source electrode 14 and drain electrode 16 during the programming process. As the voltage level of the floating gate 12 ($V_G$) increases, the channel becomes inverted. Because source electrode 14 and drain electrode 16 are at the same voltage level, there is no current flowing through the channel of FET 11. Hot electrons are generated in the substrate and injected onto floating gate 12, thereby programming NVM cell 10 through a substrate hot electron injection process. To further improve the substrate hot carrier injection efficiency, substrate electrode 18 may be biased at a negative voltage level. Another technique for programming NVM cell 10 through substrate hot electron injection involves applying the programming voltage level ($V_P$) to drain electrode 16 while isolating source electrode 14 from an applied voltage level.

To erase NVM cell 10, drain electrode 16 and substrate electrode 18 of FET 11 are coupled to a ground voltage level. An erasing voltage level ($V_E$) of, for example, 11V, is applied to source electrode 14. According to equation 1, the voltage level at floating gate 12 is approximated by equation 4:

$$V_G = \frac{C_{GS}}{C_T} V_E. \quad \text{(equation 4)}$$

Because of the small capacitance of $C_{GS}$ compared with $C_{GD}$, $V_G$ is at a voltage level significantly lower than $V_E$. The voltage difference between floating gate 12 and source electrode 14 establishes an electric field in a region where floating gate 12 and the source region, such as source region 44 of FIG. 2 or source region 74 of FIG. 3, overlap. This electric field causes electrons stored in floating gate 12 to move away from floating gate 12 into the source region via a tunneling process. After the tunneling process, floating gate 12 becomes substantially electrically neutral. Floating gate 12 may also become positively charged in an overerasing process. When the erasing voltage level ($V_E$) is removed from source electrode 14, floating gate 12 remains substantially electrically neutral or positively charged. In either case, a logic zero is written into NVM cell 10, i.e., NVM cell 10 is erased.

As electrons move away from floating gate 12 during the erasing process, the threshold voltage ($V_T$) of FET 11 decreases according to equation 2. When the threshold voltage ($V_T$) drops below the voltage of floating gate 12 ($V_G$), FET 11 is switched on. After FET 11 is switched on, the voltage difference between source electrode 14 and drain electrode 16 generates a current flowing through the channel of FET 11. In one approach for reducing the power consumption of the erasing process caused by the current flowing through the channel of FET 11, substrate electrode 18 is biased at a negative voltage level instead of being coupled to a ground voltage level as described hereinbefore. The negative substrate bias increases the effective threshold voltage of FET 11 and, therefore, delays the switch-on of FET 11. In another approach, drain electrode 16 is isolated from external circuitry during the erasing process instead of being coupled to a ground voltage level as described hereinbefore. The open circuit at drain electrode 16 prevents a current flowing in the channel of FET 11 even after FET 11 is switched on.

To read data stored in NVM cell 10, source electrode 14 and substrate electrode 18 of FET 11 are coupled to a ground voltage level. A reading voltage level ($V_R$) of, for example, 2V, is applied to drain electrode 16. According to equation 1, the voltage level at floating gate 12 is approximated by equation 5:

$$V_G = \frac{C_{GD}}{C_T} V_R. \quad \text{(equation 5)}$$

If NVM cell 10 has been programmed, floating gate 12 is negatively charged. According to equation 2, FET 11 has a threshold voltage ($V_T$) higher than its intrinsic threshold voltage ($V_{TO}$). If NVM cell 10 has been erased, floating gate 12 is substantially electrically neutral or positively charged. According to equation 2, FET 11 has a threshold voltage substantially equal to or less than its intrinsic threshold voltage ($V_{TO}$). Preferably, the reading voltage $V_R$ is such that the voltage of floating gate 12 ($V_G$) is lower than the threshold voltage of FET 11 if NVM cell 10 has been programmed and higher than the threshold voltage of FET 11 if NVM cell 10 has been erased. Furthermore, in order to avoid hot carrier injection during the reading process, the reading voltage level ($V_R$) applied to drain electrode 16 is preferably lower than the drain bias required to cause significant hot carrier injection. Therefore, when reading data from a programmed NVM cell 10, FET 11 is nonconductive and the current flowing through the channel of FET 11 is very small, e.g., less than approximately 2 microamperes ($\mu A$). A sense amplifier (not shown in FIG. 1) coupled to drain line 17 senses the small current and reads a logic one from NVM cell 10. Likewise, when reading data from an erased NVM cell 10, FET 11 is conductive. The current flowing through the channel of FET 11 is large, e.g., more than approximately 10 $\mu A$. The sense amplifier (not shown in FIG. 1) coupled to drain line 17 senses the large current and reads a logic zero from NVM cell 10.

It should be noted that the reading process is not limited to that described hereinbefore. In an alternative embodiment, the reading process is performed by applying a reading voltage level of, for example, 1V, to source electrode 14 while grounding drain electrode 16 and substrate electrode 18. Thus, source electrode 14 functions as the drain of FET 11 and drain electrode 16 functions as the source of FET 11 during the reading process. A sense amplifier (not shown in FIG. 1) coupled to source line 15 senses the current flowing through FET 11 and reads out data stored in NVM cell 10.

By now it should be appreciated that an NVM cell and a method for accessing the NVM cell have been provided. The NVM cell of the present invention is a single transistor, single gate NVM cell and, therefore, is simple and cost efficient to fabricate. Unlike the single-poly NVM cells in the prior art, the NVM cell of the present invention does not use additional silicon area in the substrate to control the potential of the floating gate of an n-channel insulated gate FET. Therefore, it is silicon area efficient. Furthermore, the NVM cell of the present invention is both electrically erasable and electrically programmable.

We claim:

1. A single gate nonvolatile memory cell, comprising:

a body of semiconductor material having a major surface;

a source region of a first conductivity type in the body of semiconductor material;

a drain region of the first conductivity type in the body of semiconductor material;

a channel region of a second conductivity type in the body of semiconductor material, the channel region separating the source region from the drain region; and a single floating gate structure above the major surface over the channel region, the single floating gate structure being capacitively coupled to the source region via a parasitic gate-source capacitor and being capacitively coupled to the drain region via a parasitic gate-drain capacitor, wherein a capacitance of the parasitic gate-source capacitor is different from a capacitance of the parasitic gate-drain capacitor to establish an electrically data erasing and programming capability of the single gate nonvolatile memory cell.

2. The single gate nonvolatile memory cell of claim 1, wherein the single floating gate structure includes:

a dielectric layer over the major surface of the body of semiconductor material overlying the channel region; and a single polycrystalline silicon layer over the dielectric layer.

3. The single gate nonvolatile memory cell of claim 1, wherein the source region extends from the major surface into the body of semiconductor material to a first depth and the drain region extends from the major surface into the body of semiconductor material to a second depth, the first depth being different from the second depth.

4. The single gate nonvolatile memory cell of claim 1, wherein the source region extends laterally under the single floating gate structure to a first distance and the drain region extends laterally under the single floating gate structure to a second distance, the first distance being different from the second distance.

5. The single gate nonvolatile memory cell of claim 1, wherein the source region has a first dopant concentration and the drain region has a second dopant concentration, the first dopant concentration being different from the second dopant concentration.

6. The single gate nonvolatile memory cell of claim 1, wherein the channel region has a first width adjacent the source region and a second width adjacent the drain region, the first width being different from the second width.

7. The single gate nonvolatile memory cell of claim 1, further comprising a drain side implantation region of the first conductivity type under a portion of the single floating gate structure adjacent the drain region.

8. A single gate electrically erasable and programmable nonvolatile memory cell, comprising:

a silicon substrate having a major surface;

a field effect transistor formed in the silicon substrate, the field effect transistor having a source region of a first conductivity type, a drain region of the first conductivity type, and a channel region of a second conductivity type and separating the source region from the drain region;

a dielectric layer over the major surface of the silicon substrate overlying a portion of the channel region;

a single floating polycrystalline silicon gate over the dielectric layer, the single floating polycrystalline silicon gate being capacitively coupled to the source region via a parasitic gate-source capacitor and being capacitively coupled to the drain region via a parasitic gate-drain capacitor, wherein a capacitance of the parasitic gate-source capacitor is smaller than a capacitance of the parasitic gate-drain capacitor;

a source electrode electrically coupled to the source region;

a drain electrode electrically coupled to the drain region; and a substrate electrode electrically coupled to the silicon substrate beneath the channel region.

9. The single gate electrically erasable and programmable nonvolatile memory cell of claim 8, wherein the source region extends from the major surface into the silicon substrate to a first depth and the drain region extends from the major surface into the silicon substrate to a second depth, the first depth being less than the second depth.

10. The single gate electrically erasable and programmable nonvolatile memory cell of claim 8, wherein the source region extends laterally under the single floating polycrystalline silicon gate to a first distance and the drain region extends laterally under the single floating polycrystalline silicon gate to a second distance, the first distance being less than the second distance.

11. The single gate electrically erasable and programmable nonvolatile memory cell of claim 8, wherein the channel region has a first width adjacent the source region and a second width adjacent the drain region, the first width being less than the second width.

12. The single gate electrically erasable and programmable nonvolatile memory cell of claim 8, wherein the field effect transistor further includes a drain side implantation region of the first conductivity type under a portion of the dielectric layer adjacent the drain region.

13. A method for accessing an electrically erasable and programmable nonvolatile memory cell, comprising the steps of:

providing a field effect transistor serving as the electrically erasable and programmable nonvolatile memory cell, the field effect transistor having a source, a drain, a substrate, and a single floating gate, the single floating gate being capacitively coupled to the source via a parasitic gate-source capacitor and being capacitively coupled to the drain via a parasitic gate-drain capacitor, wherein a capacitance of the parasitic gate-source capacitor is less than a capacitance of the parasitic gate-drain capacitor; and applying a programming voltage level to the drain, thereby causing electric charge to move from a channel region of the field effect transistor onto the single floating gate through hot carrier injection.

14. The method of claim 13, further comprising the steps of:

applying a source voltage level to the source; and applying a substrate voltage level to the substrate.

15. The method of claim 14, wherein the step of applying a source voltage level and the step of applying a substrate voltage level further include applying a ground voltage level.

16. The method of claim 13, further comprising the step of applying an erasing voltage level to the source, thereby causing electric charge in the single floating gate to move away from the single floating gate into the channel region through tunneling.

17. The method of claim 16, further comprising the steps of:

applying a drain voltage level to the drain; and applying a substrate voltage level to the substrate.

18. The method of claim 13, further comprising the steps of:

applying a source voltage level to the source;

applying a substrate voltage level to the substrate;

applying a reading voltage level to the drain, wherein the reading voltage level is lower than the programming voltage level; and sensing a current flowing through the channel region of the field effect transistor to read data from the electrically erasable and programmable nonvolatile memory cell.

19. The method of claim 16, further comprising the steps of:

applying a drain voltage level to the drain;

applying a substrate voltage level to the substrate;

applying a reading voltage level to the source, wherein the reading voltage level is lower than the erasing voltage level; and sensing a current flowing through the channel region of the field effect transistor to read data from the electrically erasable and programmable nonvolatile memory cell.

* * * * *